(12) United States Patent
Tsugao et al.

(10) Patent No.: US 12,377,384 B2
(45) Date of Patent: Aug. 5, 2025

(54) SUBSTRATE PROCESSING APPARATUS AND CONTROL METHOD OF SUBSTRATE PROCESSING APPARATUS

(71) Applicant: Tokyo Electron Limited, Tokyo (JP)

(72) Inventors: Keisuke Tsugao, Koshi (JP); Tomonori Okumura, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 525 days.

(21) Appl. No.: 17/806,150

(22) Filed: Jun. 9, 2022

(65) Prior Publication Data

US 2022/0399209 A1 Dec. 15, 2022

(30) Foreign Application Priority Data

Jun. 10, 2021 (JP) .................................. 2021-097100

(51) Int. Cl.
*B01D 53/78* (2006.01)
*B01D 53/34* (2006.01)
(Continued)

(52) U.S. Cl.
CPC .......... *B01D 53/78* (2013.01); *B01D 53/346* (2013.01); *C23C 16/4412* (2013.01);
(Continued)

(58) Field of Classification Search
None
See application file for complete search history.

(56) References Cited

U.S. PATENT DOCUMENTS

2009/0165685 A1* 7/2009 Chen .................... B01D 47/06
110/216
2016/0020085 A1* 1/2016 Iwao ................... B01D 53/346
134/109

FOREIGN PATENT DOCUMENTS

CN 109351061 A * 2/2019
JP H11-040497 A 2/1999
(Continued)

OTHER PUBLICATIONS

JPWO2018150979A1_ENG (Espacenet machine translation of Toshima) (Year: 2018).*
(Continued)

*Primary Examiner* — Gabriel E Gitman
(74) *Attorney, Agent, or Firm* — Chrisman Gallo Tochtrop LLC

(57) ABSTRACT

A substrate processing apparatus includes processing units, an exhaust path, a gas processing apparatus and a controller. Each processing unit is configured to process a substrate by using a chemical. A gas exhausted from the processing units flows through the exhaust path. The gas processing apparatus is provided in the exhaust path to remove a target component contained in the gas. The gas processing apparatus includes a duct, a partition plate and a liquid supply. The duct has therein a flow path. The partition plate divides the flow path into spaces, and is formed of a porous material, through which the gas passes, configured to retain a liquid. The liquid supply is configured to supply a dissolving liquid configured to dissolve the target component to the partition plate. The controller adjusts a flow rate of the dissolving liquid according to operation information indicating an operational status of the processing units.

13 Claims, 7 Drawing Sheets

(51) Int. Cl.
*C23C 16/44* (2006.01)
*B01D 46/00* (2022.01)
*B01D 53/58* (2006.01)
*B01D 53/68* (2006.01)
*H01L 21/67* (2006.01)

(52) U.S. Cl.
CPC .......... *B01D 46/0035* (2013.01); *B01D 53/58* (2013.01); *B01D 53/68* (2013.01); *B01D 2258/0216* (2013.01); *H01L 21/67155* (2013.01)

(56) References Cited

FOREIGN PATENT DOCUMENTS

| | | |
|---|---|---|
| JP | 2013-021026 A | 1/2013 |
| JP | 2014-175361 A | 9/2014 |
| JP | 2015-211938 A | 11/2015 |
| WO | WO-2018150979 A1 * | 8/2018 ............. B01D 53/18 |

OTHER PUBLICATIONS

CN109351061A_ENG (Espacenet machine translation of Qin) (Year: 2019).*

* cited by examiner

SUBSTRATE PROCESSING APPARATUS AND CONTROL METHOD OF SUBSTRATE PROCESSING APPARATUS

CROSS-REFERENCE TO RELATED APPLICATION

This application claims the benefit of Japanese Patent Application No. 2021-097100 filed on Jun. 10, 2021, the entire disclosure of which is incorporated herein by reference.

TECHNICAL FIELD

The various aspects and embodiments described herein pertain generally to a substrate processing apparatus and a control method of the substrate processing apparatus.

BACKGROUND

An exhaust gas exhausted from a substrate processing apparatus that processes a substrate such as a semiconductor wafer may contain a component of a chemical used for the processing of the substrate, for example, an acidic component, an alkaline component, or an organic component.

The exhaust gas containing such chemical component may affect the environment and the human body by being released into the atmosphere. For this reason, a removing apparatus called a scrubber serving to remove the chemical component from the exhaust gas may be provided in an exhaust path of the exhaust gas in the substrate processing apparatus.

Patent Document 1 discloses a scrubber equipped with a housing having therein a nozzle for spraying a dissolving liquid that dissolves the chemical component contained in the exhaust gas. This scrubber removes the chemical component from the exhaust gas by bringing the dissolving liquid sprayed from the nozzle into contact with the exhaust gas introduced in the housing.

Patent Document 1: Japanese Patent Laid-open Publication No. 2013-021026

SUMMARY

In one exemplary embodiment, a substrate processing apparatus includes multiple processing units, an exhaust path, a gas processing apparatus and a controller. Each of the multiple processing units is configured to process a substrate by using a chemical. A gas exhausted from the multiple processing units flows through the exhaust path. The gas processing apparatus is provided in the exhaust path to remove a target component contained in the gas flowing through the exhaust path from the gas. The controller is configured to control the multiple processing units and the gas processing apparatus. The gas processing apparatus includes a duct, a partition plate and a liquid supply. The duct has therein a flow path through which the gas passes. The partition plate is configured to divide the flow path into multiple spaces, and is formed of a porous material, through which the gas passes, configured to retain a liquid. The liquid supply is configured to supply a dissolving liquid configured to dissolve the target component contained in the gas to the partition plate. The controller adjusts a flow rate of the dissolving liquid supplied to the partition plate from the liquid supply according to operation information indicating an operational status of the multiple processing units.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
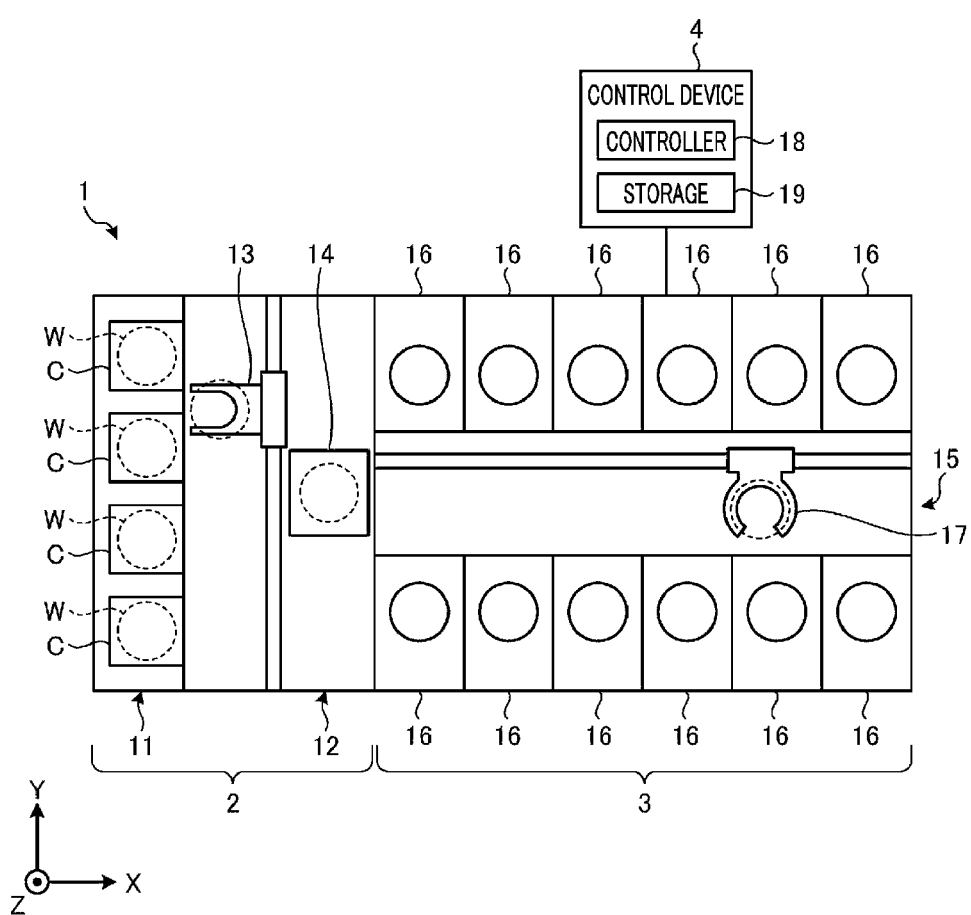
FIG. 1 is a diagram illustrating a schematic configuration of a substrate processing system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of a substrate processing apparatus and a control method of the substrate processing apparatus according to the present disclosure will be described in detail with reference to the accompanying drawings. However, it should be noted that the inventive concept of the present disclosure is not limited by the following exemplary embodiments.

First Exemplary Embodiment

First, a configuration of a substrate processing system according to a first exemplary embodiment will be explained with reference to FIG. 1.

FIG. 1 is a plan view illustrating an outline of a substrate processing system according to an exemplary embodiment. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the substrate processing system 1 is provided with a control device 4. The control device 4 is, for example, a computer, and includes a controller 18 and a storage unit 19. The storage unit 19 stores a program that controls various processings performed in the substrate processing system 1. The controller 18 controls the operations of the substrate processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the delivery unit 14. The wafer W placed on the delivery unit 14 is taken out from the delivery unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Figure 2:
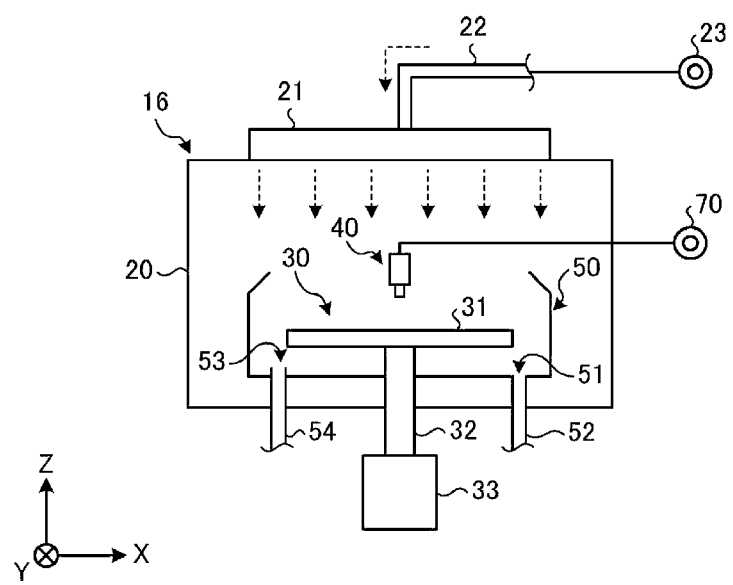
FIG. 2 is a diagram illustrating a configuration of a processing unit according to a first exemplary embodiment.

Now, a configuration of the processing unit 16 and an exhaust path of the processing unit 16 will be described with reference to FIG. 2 and FIG. 3. FIG. 2 is a diagram illustrating a configuration of the processing unit 16 according to the first exemplary embodiment.

As illustrated in FIG. 2, the processing unit 16 includes a chamber 20, a substrate holding mechanism 30, a processing fluid supply 40, and a recovery cup 50.

The chamber 20 accommodates therein the substrate holding mechanism 30, the processing fluid supply 40, and the recovery cup 50. A FFU (Fan Filter Unit) 21 is provided at a ceiling portion of the chamber 20. A gas source 23 is connected to the FFU 21 via a gas supply line 22. The FFU 21 creates a downflow in the chamber 20 by supplying a gas supplied from the gas source 23 through the gas supply line 22 from an upper side in the chamber 20 toward a lower side thereof.

The substrate holding mechanism 30 is equipped with a holder 31, a supporting column 32, and a driver 33. The holder 31 holds the wafer W horizontally. The supporting column 32 is a vertically extending member. A base end of the supporting column 32 is rotatably supported by the driver 33. The supporting column 32 supports the holder 31 horizontally at a leading end thereof. The driver 33 is configured to rotate the supporting column 32 around a vertical axis. This substrate holding mechanism 30 rotates the supporting column 32 by using the driver 33, thus allowing the holder 31 supported on the supporting column 32 to be rotated. Accordingly, the wafer W held by the holder 31 is also rotated.

The processing fluid supply 40 is configured to supply a processing fluid to the wafer W. The processing fluid supply 40 is connected to a processing fluid source 70.

The recovery cup 50 is disposed to surround the holder 31, and collects the processing liquid scattered from the wafer W when the holder 31 is rotated. A drain port 51 is formed at a bottom of the recovery cup 50, and a drain line 52 is connected to the drain port 51. The processing liquid collected by the recovery cup 50 is drained from the drain port 51 to an outside of the processing unit 16 through the drain line 52.

In addition, an exhaust port 53 for exhausting the gas supplied from the FFU 21 to the outside of the processing unit 16 is formed at the bottom of the recovery cup 50. An exhaust line 54 is connected to the exhaust port 53, and the gas supplied from the FFU 21 to the processing unit 16 is exhausted from the exhaust port 53 to the outside of the processing unit 16 through the exhaust line 54.

Here, the gas exhausted from the processing unit 16 (hereinafter, referred to as "exhaust gas") may include a component of the processing fluid supplied from the processing fluid supply 40. By way of example, when the processing fluid is an acidic, alkaline or organic chemical, the exhaust gas may include an acidic component, an alkaline component, or an organic component.

Moreover, the acidic chemical may be, by way of non-limiting example, DHF (dilute hydrofluoric acid), BHF (mixed solution of hydrofluoric acid and ammonium fluoride), or the like. Further, the alkaline chemical may be, by way of example, but not limitation, SC1 (a mixed solution of ammonia, hydrogen peroxide and water). Also, the organic chemical may be, by way of non-limiting example, IPA (isopropyl alcohol). The chemicals are not limited to the liquids, but may be gases.

The exhaust gas containing the above-mentioned components may affect the environment and the human body by being released into the atmosphere. In view of this, the substrate processing system 1 according to the first exemplary embodiment is equipped with a gas processing apparatus 100 (see FIG. 3) configured to remove a target component including at least any one of the acidic component, the alkaline component and the organic component from the exhaust gas exhausted from the processing unit 16. The gas processing apparatus 100 is provided in an exhaust path of the substrate processing system 1.

Figure 3:
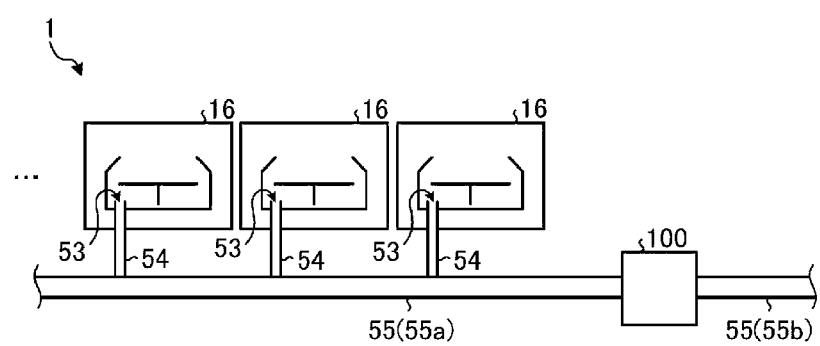
FIG. 3 is a diagram illustrating a configuration of an exhaust path of the processing unit according to the first exemplary embodiment.

FIG. 3 is a diagram illustrating a configuration of the exhaust path of the processing unit 16 according to the first exemplary embodiment. As depicted in FIG. 3, the substrate processing system 1 according to the first exemplary embodiment includes a plurality of exhaust lines 54. One ends of the plurality of exhaust lines 54 are respectively connected to the exhaust ports 53 of the plurality of processing units 16, and the other ends are connected to a collective exhaust line 55.

As shown in FIG. 3, the gas processing apparatus 100 is provided in the collective exhaust line 55. The collective exhaust line 55 constitutes a part of an exhaust path included in the substrate processing system 1, and is provided within the substrate processing system 1. Further, the gas processing apparatus 100 is also provided within the substrate processing system 1. The exhaust gas from which the target component has been removed by the gas processing apparatus 100 is exhausted from the substrate processing system 1 through the collective exhaust line 55. Furthermore, in case that the collective exhaust line 55 is extended to the outside of the substrate processing system 1, the gas processing apparatus 100 may be provided outside the substrate processing system 1. In addition, when a plurality of collective exhaust lines 55 respectively provided in a plurality of substrate processing systems 1 are connected to one merged exhaust line, the gas processing apparatus 100 may be provided in such a merged exhaust line.

Figure 4:
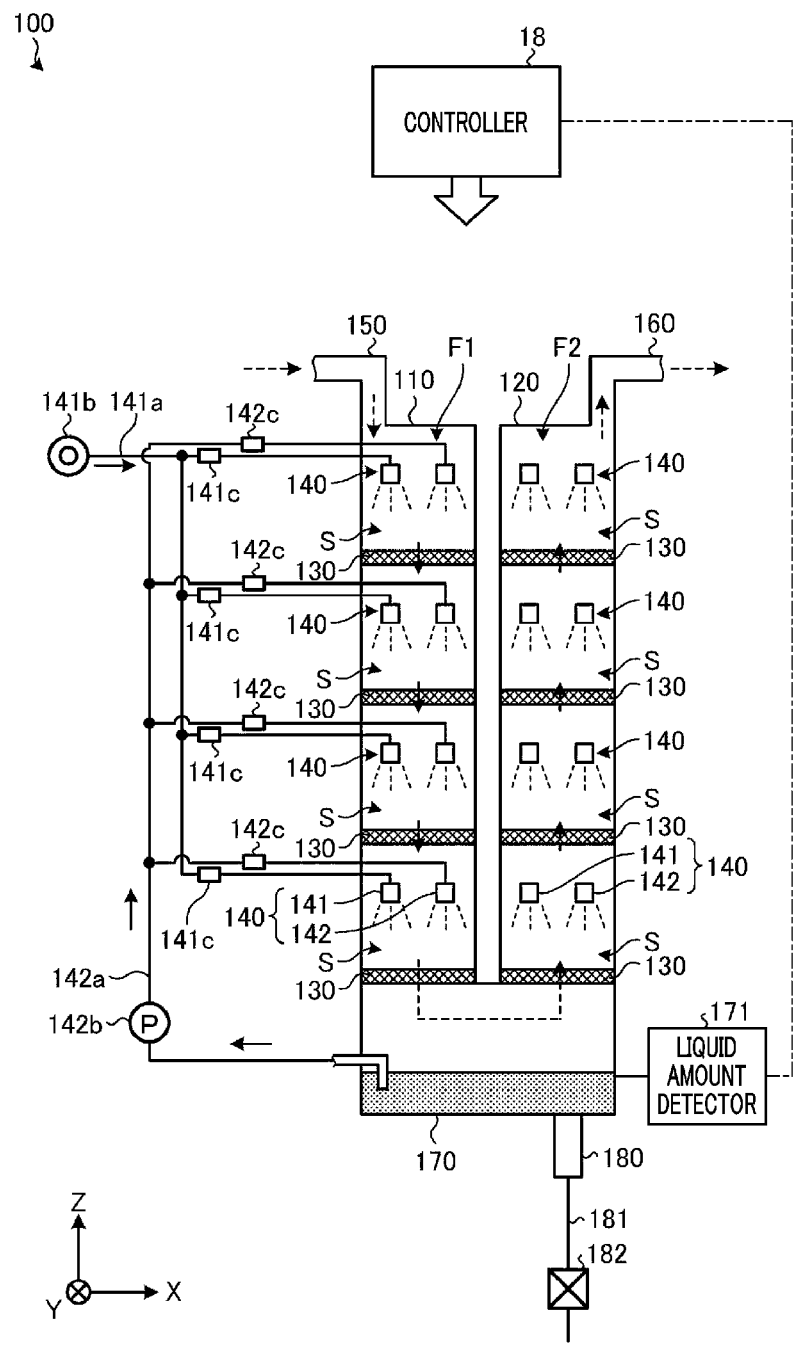
FIG. 4 is a diagram illustrating a configuration of a gas processing apparatus according to the first exemplary embodiment.

Now, a configuration of the gas processing apparatus 100 will be described with reference to FIG. 4. FIG. 4 is a diagram showing a configuration of the gas processing apparatus 100 according to the first exemplary embodiment. In FIG. 4, a flow of the exhaust gas is indicated by dashed-lined arrows, and a flow of the dissolving liquid is indicated by solid-lined arrows.

As shown in FIG. 4, the gas processing apparatus 100 includes a first duct 110, a second duct 120, partition plates 130, liquid supplies 140, a gas inlet 150, a gas outlet 160, a storage tank 170, and a liquid outlet 180.

The first duct 110 has a first flow path F1 therein, and the second duct 120 has a second flow path F2 therein. The first duct 110 and the second duct 120 are disposed to extend in a vertical direction (Z-axis direction). The first duct 110 and the second duct 120 may have any of various shapes, such as, but not limited to, a cylindrical shape or a rectangular cylindrical shape.

The gas inlet 150 connects the first duct 110 to an upstream collective exhaust line 55a (see FIG. 3) of the collective exhaust line 55 located upstream of the gas processing apparatus 100, and introduces the exhaust gas flowing in the upstream collective exhaust line 55a into the first flow path F1. The gas outlet 160 connects a downstream collective exhaust line 55b (see FIG. 3) of the collective exhaust line 55 located downstream of the gas processing apparatus 100 to the second duct 120, and sends the exhaust gas having passed through the second flow path F2 into the downstream collective exhaust line 55b from the second duct 120. A lower end side of the first duct 110, that is, a lower portion of the first flow path F1 and a lower end side of the second duct 120, that is, a lower portion of the second flow path F2 are connected to each other with the storage tank 170 therebetween.

Specifically, the gas inlet 150 is connected to an upper end side of the first duct 110 and introduces the exhaust gas from the upper end side of the first duct 110 (that is, the upper portion of the first flow path F1) into the first flow path F1. Further, the gas outlet 160 is connected to an upper end side of the second duct 120, and exhausts the exhaust gas from the upper end side of the second duck 120 (that is, the upper portion of the second flow path F2) into the downstream collective exhaust line 55b. Accordingly, a flow of the exhaust gas flowing from the upper side to the lower side is formed in the first flow path F1; a flow of the exhaust gas flowing from the lower portion of the first flow path F1 to the lower portion of the second flow path F2 is formed in the storage tank 170; and a flow of the exhaust gas flowing from the lower side to the upper side is formed in the second flow path F2.

The partition plates 130 are disposed in each of the first flow path F1 of the first duct 110 and the second flow path F2 of the second duct 120. The partition plates 130 divide each of the first flow path F1 and the second flow path F2 into a plurality of spaces S adjacent to each other in the vertical direction.

The partition plate 130 is a porous member formed of a porous material through which the exhaust gas passes while retaining a liquid. As such a porous material forming the partition plate 130, porous ceramic may be used, for example. The porous ceramic is ceramic containing silicon (Si) and silicon carbide (SiC) at least. The porous ceramic is formed by reinforcing a three-dimensional structure made of silicon (Si) with silicon carbide (SiC). The porous ceramic may further contain aluminum nitride or silicon nitride.

The partition plates 130 are detachably mounted to a plurality of mounting positions at which the sizes of the plurality of spaces S of the first and second flow paths F1 and F2 can be adjusted. For example, in each of the first flow path F1 and the second flow path F2, a plurality of rails extending in the horizontal direction are formed at a regular distance therebetween in the vertical direction, and the partition plate 130 is detachably mounted to any required rail among the plurality of rails of the first flow path F1 and the second flow path F2. By mounting the partition plates 130 to all the rails of the first flow path F1 and the second flow path F2, the sizes of the plurality of spaces S become the same. By separating the partition plates 130 from some rails among all the rails, the sizes of some space S can be increased. The sizes of the plurality of spaces S may be same or different between the first duct 110 and the second duct 120. In addition, the sizes of the plurality of spaces S may be same or different in the first duct 110 or in the second duct 120.

At least one liquid supply 140 is disposed in each space S. Specifically, the liquid supply 140 is disposed above the partition plate 130 in each space S. The liquid supply 140 is configured to supply the dissolving liquid toward the partition plate 130 provided therebelow.

The liquid supply 140 includes a first liquid supply 141 and a second liquid supply 142.

The first liquid supply 141 is connected to a dissolving liquid source 141b via a supply line 141a. A supply device group 141c is provided in the supply line 141a to correspond to the first liquid supply 141 of each space S. The dissolving liquid source 141b supplies, for example, pure water or tap water as a dissolving liquid configured to dissolve the target component contained in the exhaust gas. Here, however, the dissolving liquid supplied from the dissolving liquid source 141b is not limited to the pure water or the tap water, and may be appropriately selected according to the kinds of the target component contained in the exhaust gas. The supply device group 141c includes, by way of example, an opening/closing valve configured to open or close the supply line 141a, a mass flow controller, a temperature regulator configured to adjust the temperature of the dissolving liquid, and so forth. In addition, although only a supply system for the dissolving liquid on the first duct 110 side (the supply line 141a, the dissolving liquid source 141b, and the supply device group 141c) is shown in FIG. 4 for simplicity of illustration, a supply system for the dissolving liquid on second duct 120 side is the same as the supply system of the dissolving liquid on the first duct 110 side.

The first liquid supply 141 supplies the dissolving liquid supplied from the dissolving liquid source 141b to the partition plate 130 provided therebelow. The dissolving liquid supplied to the partition plate 130 permeates the porous structure inside the partition plate 130 from a top surface of the partition plate 130 to be temporarily retained by the partition plate 130.

The second liquid supply 142 is connected to a circulating liquid line 142a. A pump 142b is provided in the circulating liquid line 142a. Further, a supply device group 142c is provided in the circulating liquid line 142a to correspond to the second liquid supply 142 of each space S. The circulating liquid line 142a is led into the used dissolving liquid stored in the storage tank 170, that is, the dissolving liquid containing the target component removed from the exhaust gas. The pump 142b pulls up the dissolving liquid from the storage tank 170 through the circulating liquid line 142a, and force-feeds it toward the second liquid supply 142. Accordingly, the dissolving liquid stored in the storage tank 170 is circulated through a circulation path composed of the circulating liquid line 142a and the pump 142b. The supply device group 141c includes, by way of example, an opening/closing valve configured to open or close the circulating liquid line 142a, a mass flow controller, a temperature regulator capable of adjusting the temperature of the circulating liquid, and so forth. Further, although only a supply system for the circulating liquid (the circulating liquid line 142a and the pump 142b) on the first duct 110 side is shown in FIG. 4 for simplicity of illustration, a supply system for the circulating liquid on the second duct 120 side is the same as the supply system of the circulating liquid on the first duct 110 side.

The second liquid supply 142 supplies the circulating liquid, which is obtained as the dissolving liquid stored in the storage tank 170 is circulated through the circulation path, to the partition plate 130 provided therebelow. The circulating liquid supplied to the partition plate 130 permeates the porous structure inside the partition plate 130 from the top surface of the partition plate 130 to be temporarily retained by the partition plate 130. Below, the circulating liquid supplied from the second liquid supply 142 and the dissolving liquid supplied from the first liquid supply 141 may sometimes be collectively referred to as "dissolving liquid."

The liquid supply 140 supplies the dissolving liquid from the upstream side of the first flow path F1 within the first duct 110 toward the partition plate 130 provided therebelow, and supplies the dissolving liquid from the downstream side of the second flow path F2 within the second duct 120 toward the partition plate 130 provided therebelow. The dissolving liquid supplied within the first duct 110 and the dissolving liquid supplied within the second duct 120 are the same kind of liquid.

The storage tank 170 connects the downstream side of the first flow path F1 of the first duct 110 to the upstream side of the second flow path F2 of the second duct 120, and stores therein the dissolving liquid falling from the partition plate 130.

The liquid outlet 180 drains the dissolving liquid stored in the storage tank 170 from the storage tank 170. A drain line 181 is connected to the liquid outlet 180, and the drain line 181 is provided with a valve 182.

Further, the gas processing apparatus 100 is equipped with a liquid amount detector 171. The liquid amount detector 171 is provided in the storage tank 170, and configured to detect the amount of the dissolving liquid stored in the storage tank 170.

The detection result of the liquid amount detector 171 is outputted to the controller 18. The supply device groups 141c and 142c, the pump 142b, and the valve 182 are controlled by the controller 18.

The controller 18 determines whether or not to perform the supply of the circulating liquid from the second liquid supply 142 based on the detection result from the liquid amount detector 171. When it is determined that the liquid amount detected by the liquid amount detector 171, that is, the amount of the dissolving liquid stored in the storage tank 170 exceeds a predetermined upper limit, the controller 18 determines to perform the supply of the circulating liquid from the second liquid supply 142. Then, the controller 18 controls the supply device group 142c and the pump 142b to start the supply of the circulating liquid from the second liquid supply 142.

In addition, the controller 18 controls the supply device groups 141c and 142c to control the flow rates and the temperatures of the dissolving liquid and the circulating liquid respectively supplied from the first liquid supply 141 and the second liquid supply 142 to the partition plate 130 for each space S.

Moreover, the controller 18 determines whether or not to perform the drain of the dissolving liquid from the liquid outlet 180 based on the detection result from the liquid amount detector 171. When it is determined that the liquid amount detected by the liquid amount detector 171, that is, the amount of the dissolving liquid stored in the storage tank 170 exceeds a predetermined upper limit, the controller 18 determines to perform the drain of the dissolving liquid from the liquid outlet 180. Then, the controller 18 opens the valve 132. Accordingly, the dissolving liquid is drained from the storage tank 170 through the liquid outlet 180, and the dissolving liquid drained from the storage tank 170 is sent to the outside through the drain line 181.

Here, it is determined whether or not to perform the supply of the circulating liquid or the drain of the dissolving liquid based on the detection result by the liquid amount detector 171. However, the controller 18 may determine whether or not to perform the supply of the circulating liquid or the drain of the dissolving liquid based on a detection result obtained by another detector. For example, the controller 18 may make a determination upon whether or not to perform the supply of the circulating liquid from the second liquid supply 142 based on a detection result by a concentration detector (not shown) configured to detect a concentration of the target component contained in the dissolving liquid stored in the storage tank 170. Further, the controller 18 may make a determination upon whether or not to perform the drain of the dissolving liquid from the liquid outlet 180 based on a detection result by a concentration detector (not shown) configured to detect the concentration of the target component included in the dissolving liquid stored in the storage tank 170. Furthermore, the controller 18 may control a flow rate of the circulating liquid supplied to the partition plate 130 from the second liquid supply 142 or a flow rate of the dissolving liquid drained from the liquid outlet 180 based on the detection result by the liquid amount detector 171 or the concentration detector (not shown).

The gas processing apparatus 100 is configured as described above, and the exhaust gas introduced into the first flow path F1 of the first duct 110 from the gas inlet 150 passes through the first flow path F1 from the upper side toward the lower side thereof while penetrating the partition plate 130.

The exhaust gas that has passed through the first flow path F1 is introduced into the second flow path F2 of the second duct 120 via the inside of the storage tank 170, and then passes through the second flow path F2 from the lower side toward the upper side thereof while penetrating the partition plate 130.

In the partition plate 130, the dissolving liquid is retained. Accordingly, the exhaust gas comes into contact with the dissolving liquid retained in the partition plate 130 while it passes through the first flow path F1 from the upper side toward the lower side thereof while penetrating the partition plate 130, or while it passes through the second flow path F2 from the lower side toward the upper side thereof while penetrating the partition plate 130.

As the exhaust gas comes into contact with the dissolving liquid retained by the partition plate 130, the target component contained in the exhaust gas is dissolved in the dissolving liquid, whereby the target component is removed from the exhaust gas. The exhaust gas free of the target component is exhausted from the second flow path F2 of the second duct 120 into the downstream collective exhaust line 55b (see FIG. 3) through the gas outlet 160. Further, the dissolving liquid containing the target component removed from the exhaust gas falls from the partition plate 130 to be stored in the storage tank 170, and then is drained from the storage tank 170 through the liquid outlet 180.

As stated above, in the gas processing apparatus 100, the dissolving liquid is retained by the partition plate 130 which is made of the porous material through which the exhaust gas passes while retaining the liquid, and by bringing the exhaust gas into contact with the dissolving liquid retained in the partition plate 130, the target component is removed from the exhaust gas.

Since the dissolving liquid retained in the partition plate 130 tends to stay in place temporarily, the dissolving liquid can be kept in the first duct 110 and the second duct 120 for a longer time, as compared to the scrubber that sprays the dissolving liquid constantly. Thus, the gas processing apparatus 100 is capable of reducing the amount of the dissolving liquid used, as compared to the scrubber.

As described above, a gas processing apparatus (for example, the gas processing apparatus 100) according to the first exemplary embodiment includes a duct (for example, the first duct 110 and the second duct 120), a partition plate (for example, the partition plate 130), and a liquid supply (for example, the liquid supply 140). The duct has therein a flow path (for example, the first flow path F1 and the second flow path F2) through which a gas (for example, the exhaust gas) passes. The partition plate is configured to divide the flow path into multiple spaces (for example, the space S), and is formed of a porous material, through which the gas passes, configured to retain a liquid. The liquid supply is configured to supply a dissolving liquid configured to dissolve a target component contained in the gas to the partition plate. The gas processing apparatus allows the gas passing through the flow path to come into contact with the dissolving liquid retained in the partition plate. Thus, according to the gas processing apparatus of the first exemplary embodiment, the amount of the dissolving liquid used can be reduced.

Further, the partition plate according to the first exemplary embodiment is detachably mounted to multiple mounting positions at which sizes of the multiple spaces of the flow path are allowed to be adjusted. Therefore, in the gas processing apparatus according to the first exemplary embodiment, the sizes of several spaces can be adjusted as required.

Furthermore, the gas processing apparatus according to the first exemplary embodiment is equipped with multiple ducts. The multiple ducts include a first duct (for example, the first duct 110) having therein a first flow path (for example, the first flow path F1) through which the gas passes from an upper side toward a lower side thereof; and a second duct (for example, the second duct 120) having therein a second flow path (for example, the second flow path F2) through which the gas passes from a lower side toward an upper side thereof. The partition plate is disposed in each of the first flow path and the second flow path to partition each of the first flow path and the second flow path into multiple spaces. The gas processing apparatus is further equipped with a storage tank (for example, the storage tank 170) configured to connect a downstream side of the first flow path to an upstream side of the second flow path, and configured to store therein the dissolving liquid falling from the partition plate. Thus, according to the gas processing apparatus of the first exemplary embodiment, the used dissolving liquid stored in the storage tank, that is, the dissolving liquid containing the target component removed from the exhaust gas can be reused.

In addition, the liquid supply includes multiple liquid supplies, and at least one of the multiple liquid supplies according to the first exemplary embodiment is disposed in each of the multiple spaces. Therefore, according to the gas processing apparatus of the first exemplary embodiment, the gas passing through the flow path can be brought into contact with the dissolving liquid retained in the partition plate in each space, so that dissolution efficiency of the target component by the dissolving liquid can be improved.

Further, the liquid supply according to the first exemplary embodiment supplies the dissolving liquid toward the partition plate from an upstream side of the first flow path in the first duct, and supplies the dissolving liquid toward the partition plate from a downstream side of the second flow path in the second duct. Thus, according to the gas processing apparatus of the first exemplary embodiment, since the possibility of the contact between the exhaust gas passing through the partition plate and the dissolving liquid supplied from the liquid supply can be increased, the dissolution efficiency of the target component by the dissolving liquid can be improved.

In addition, the dissolving liquid supplied in the first duct and the dissolving liquid supplied in the second duct according to the first exemplary embodiment are of a same kind. Thus, according to the gas processing apparatus of the first exemplary embodiment, it is possible to remove the target component including at least one of an acidic component, an alkaline component or an organic component from the exhaust gas by using the same type of dissolving liquid shared by the first duct and the second duct.

Further, the liquid supply according to the first exemplary embodiment includes a first liquid supply (for example, the first liquid supply 141) and a second liquid supply (for example, the second liquid supply 142). The first liquid supply is configured to supply the dissolving liquid supplied from a dissolving liquid source (for example, the dissolving liquid source 141b) to the partition plate. The second liquid supply is configured to supply a circulating liquid obtained by circulating the dissolving liquid stored in the storage tank through a circulation path (for example, the circulating liquid line 142a and the pump 142b) to the partition plate. Thus, according to the gas processing apparatus of the first exemplary embodiment, it is possible to reduce the amount of the dissolving liquid replenished from the dissolving liquid source.

Moreover, flow rates and temperatures of the dissolving liquid and the circulating liquid supplied to the partition plate from the first liquid supply and the second liquid supply according to the first exemplary embodiment are adjusted for each of the multiple spaces individually. Thus, according to the gas processing apparatus of the first exemplary embodiment, it is possible to adjust, for each space, the flow rates and the temperatures of the dissolving liquid and the circulating liquid supplied to the partition plate to flow rates and temperatures suitable for the removal of the target component.

In addition, the gas processing apparatus according to the first exemplary embodiment is further equipped with a liquid amount detector (for example, the liquid amount detector 171) and a controller (for example, the controller 18). The liquid amount detector is configured to detect an amount of the dissolving liquid stored in the storage tank. The controller is configured to determine, based on a detection result of the liquid amount detector, whether or not to perform a supply of the circulating liquid from the second liquid supply. Thus, according to the gas processing apparatus of the first exemplary embodiment, since it is possible to stand by for the supply of the circulating liquid until the amount of the dissolving liquid stored in the storage tank reaches an appropriate liquid amount, excessive use of the circulating liquid can be suppressed.

Furthermore, the gas processing apparatus according to the first exemplary embodiment is further equipped with a liquid outlet through which the dissolving liquid stored in the storage tank is drained from the storage tank. The controller determines, based on the detection result of the liquid amount detector, whether or not to perform a drain of the dissolving liquid from the liquid outlet. Thus, according to the gas processing apparatus of the first exemplary embodiment, since it is possible to stand by for the drain of the dissolving liquid until the liquid amount of the dissolving liquid stored in the storage tank reaches an appropriate liquid amount, the amount of the dissolving liquid to be reused can be secured.

Further, a substrate processing apparatus (for example, the substrate processing system 1) according to the first exemplary embodiment includes multiple processing units (for example, the processing units 16), an exhaust path (for example, the collective exhaust line 55), and a gas processing apparatus (for example, the gas processing apparatus 100). Each of the multiple processing units is configured to process a substrate (for example, the wafer W) by using a chemical (for example, a processing fluid). A gas (for example, the exhaust gas) exhausted from the multiple processing units flow through the exhaust path. The gas processing apparatus 100 is provided in the exhaust path to remove a target component contained in the gas flowing through the exhaust path from the gas. Thus, according to the substrate processing apparatus of the first exemplary embodiment, the clean exhaust gas from which the target component has been removed can be exhausted to the outside of the substrate processing apparatus.

Moreover, a gas processing apparatus (for example, the gas processing apparatus 100) according to the first exemplary embodiment includes a duct (for example, the first duct 110 and the second duct 120), a porous member (for example, the partition plate 130), and a liquid supply (for example, the liquid supply 140). The duct has therein a flow path (for example, the first flow path F1 and the second flow path F2) through which a gas (for example, the exhaust gas) passes. The porous member is disposed in the flow path, and is formed of a porous material, through which the gas passes, configured to retain a liquid. The liquid supply is configured to supply a dissolving liquid configured to dissolve a target component contained in the gas to the porous member. The porous material forming the porous member is porous ceramic. The gas processing apparatus allows the gas passing through the flow path to come into contact with the dissolving liquid retained in the porous member. Thus, according to the gas processing apparatus of the first exemplary embodiment, it is possible to reduce the amount of the dissolving liquid used while improving durability of the porous member.

Additionally, the porous ceramic according to the first exemplary embodiment is a ceramic containing silicon (Si) and silicon carbide (SiC) at least. Thus, according to the gas processing apparatus of the first exemplary embodiment, since the strength of the porous member can be maintained even when the porous member is thinned, the durability of the porous member can be further improved.

Second Exemplary Embodiment

In the substrate processing system 1, the operational status of the plurality of processing units 16 change every moment. For example, the number of processing units 16 being currently operated, that is, the number of processing units 16 that are performing the substrate processing with the processing fluid increases or decreases for each time period.

For example, when the flow rate of the dissolving liquid supplied to the partition plate 130 from the liquid supply 140 is constant regardless of the number of the processing units 16 being operated, there is a risk that the dissolving liquid may be consumed more than required in a time period when the number of the processing units 16 being operated decreases.

In view of the foregoing, a substrate processing system 1 according to a second exemplary embodiment is configured to perform a flow rate adjusting processing of adjusting a flow rate of the dissolving liquid supplied to the partition plate 130 from the liquid supply 140 (the first liquid supply 141 and the second liquid supply 142) based on operation information indicating the operational status of the plurality of processing units 16.

Figure 5:
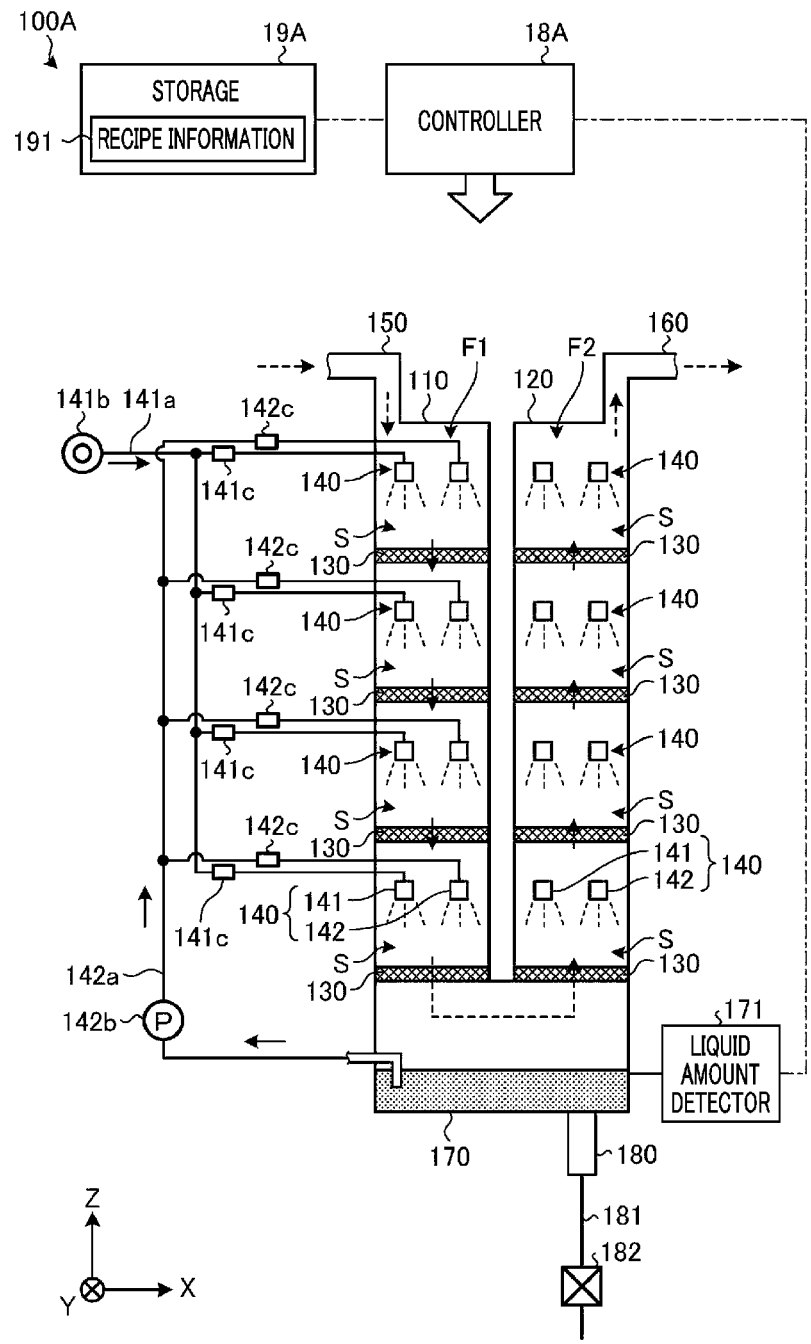
FIG. 5 is a diagram illustrating a configuration of a gas processing apparatus according to a second exemplary embodiment.

FIG. 5 is a diagram showing a configuration of a gas processing apparatus 100A according to the second exemplary embodiment. In FIG. 5, a flow of an exhaust gas is indicated by dashed-lined arrows, and a flow of a cleaning liquid is indicated by solid-lined arrows, the same as in FIG. 4. Further, in FIG. 5, parts identical to those in FIG. 4 will be assigned the same reference numerals.

The plurality of processing units 16 and the gas processing apparatus 100A of the substrate processing system 1 according to the second exemplary embodiment are controlled by a controller 18A. Further, the aforementioned flow rate adjusting processing is performed according to recipe information 191 stored in a storage 19A, for example.

The recipe information 191 is an example of the operation information indicating the operational status of the plurality of processing units 16, and it includes the number of processing units 16 to be operated for each time period.

The controller 18A performs the flow rate adjusting processing based on the number of processing units 16 included in the recipe information 191. That is, based on the number of processing units 16 included in the recipe information 191, the controller 18A controls the flow rate of the dissolving liquid supplied to the partition plate 130 from the first liquid supply 141 and the flow rate of the circulating liquid supplied to the partition plate 130 from the second liquid supply 142.

Figure 6:
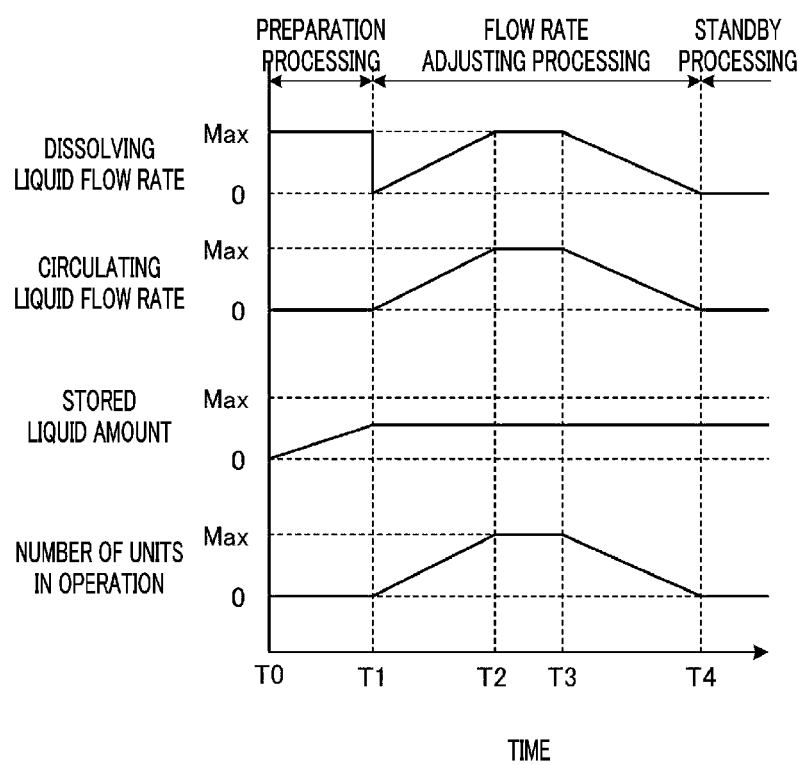
FIG. 6 is a timing chart illustrating an example of operations of individual components in a flow rate adjusting processing according to the second exemplary embodiment.

Now, the flow rate adjusting processing of the dissolving liquid controlled by the controller 18A will be explained with reference to FIG. 6. FIG. 6 is a timing chart illustrating an example of operations of individual components in the flow rate adjusting processing according to the second exemplary embodiment. In FIG. 6, "dissolving liquid flow rate" indicates variation of the flow rate of the dissolving liquid supplied to the partition plate 130 from the first liquid supply 141, and "circulating liquid flow rate" indicates variation of the flow rate of the circulating liquid supplied to the partition plate 130 from the second liquid supply 142. Further, in FIG. 6, "stored liquid amount" represents the amount of the liquid detected by the liquid amount detector 171, that is, variation of the amount of the dissolving liquid stored in the storage tank 170. Furthermore, in FIG. 6, "the number of units in operation" indicates the number of processing units 16 included in the recipe information 191.

In the example of FIG. 6, a preparation processing, the flow rate adjusting processing, and a standby processing are performed in sequence. First, the controller 18A operates the supply device group 141c from a time T0 to start the preparation processing of supplying the dissolving liquid from the first liquid supply 141 to the partition plate 130 at a maximum flow rate. This preparation processing is a process of storing the dissolving liquid to be reused in the storage tank 170 before the flow rate adjusting processing is begun.

Then, at a time T1 when the amount of the dissolving liquid stored in the storage tank 170 reaches a predetermined liquid amount and the preparation processing is finished, the controller 18A sends, among the plurality of processing units 16, the processing unit 16 to be operated first a signal for starting the supply of the processing fluid. Accordingly, the plurality of processing units 16 start the processings of the wafer W with the processing fluid.

Moreover, the controller 18A starts the flow rate adjusting processing from the time T1. To elaborate, the controller 18A operates the supply device groups 141c and 142c and the pump 142b from the time T1 to start the supply of the dissolving liquid from the liquid supply 140 (the first liquid supply 141 and the second liquid supply 142).

In the flow rate adjusting processing, the controller 18A first increases the flow rate of the dissolving liquid supplied from the first liquid supply 141 and the flow rate of the circulating liquid supplied from the second liquid supply 142 as the number of processing units 16 (the number of units in operation) included in the recipe information 191 increases from the time T1.

If the flow rates of the dissolving liquid and the circulating liquid supplied to the partition plate 130 are increased according to the increase in the number of the processing units 16 included in the recipe information 191, that is, in the number of the processing units 16 being operated, the amount of the dissolving liquid retained in the partition plate 130 increases. Thus, the possibility of the contact between the exhaust gas penetrating the partition plate 130 and the dissolving liquid retained in the partition plate 130 can be increased, so that the dissolution efficiency of the target component by the dissolving liquid can be improved.

Subsequently, starting from a time T2 when the number of units in operation reaches a maximum value, the dissolving liquid is supplied from the first liquid supply 141 to the partition plate 130 at a maximum flow rate, and the circulating liquid is supplied from the second liquid supply 142 to the partition plate 130 at a maximum flow rate.

Thereafter, from a time T3 upon the lapse of a preset time from the time T2, the controller 18A decreases the flow rate of the dissolving liquid supplied from the first liquid supply 141 and the flow rate of the circulating liquid supplied from the second liquid supply 142 as the number of units in operation decreases.

In a time period when the number of processing units 16 included in the recipe information 191, that is, the number of processing units 16 being operated decreases, the amount of the component of the processing fluid included in the exhaust gas is not so large. In this case, by reducing the flow rates of the dissolving liquid and the circulating liquid to be supplied to the partition plate 130, it is possible to lower the dissolution efficiency of the target component by the dissolving liquid. Accordingly, excessive consumption of the dissolving liquid can be suppressed, so that the amount of the dissolving liquid used can be reduced.

Next, the controller 18A stops the supply device groups 141c and 142c and the pump 142b at a time T4 when a signal indicating that the processing of the wafer W is ended is received from all the processing units 16, to thereby stop the supply of the dissolving liquid from the liquid supply 140. Then, the controller 18A starts the standby processing from the time T4. This standby processing is a process of waiting for the next substrate processing by the plurality of processing units 16 to be begun.

In this standby processing, the state in which the supply of the dissolving liquid from the liquid supply 140 is stopped is continued. Therefore, the consumption amount of the dissolving liquid can be reduced.

In addition, here, although the case where the recipe information 191 is information including the number of processing units 16 to be operated for each time period is taken as an example, the content of the recipe information 191 is not limited thereto. The recipe information 191 may be any information as long as it is information indicating the operational status of the plurality of processing units 16. By way of example, the recipe information 191 may be information including the amount or the concentration of the target component contained in the exhaust gas exhausted from the plurality of processing units 16 for each time period. In this case, the controller 18A adjusts the flow rate of the dissolving liquid supplied from the liquid supply 140 to the partition plate 130 based on the amount or the concentration of the target component included in the recipe information 191.

Further, the recipe information 191 may further include the kind of the target component in addition to the amount or the concentration of the target component. In this case, the controller 18A may change the kind of the dissolving liquid supplied from the liquid supply 140 to the partition plate 130 based on the kind of the target component included in the recipe information 191. Thus, it is possible to change the kind of the dissolving liquid appropriately according to the kind of the target component included in the recipe information 191. Furthermore, the controller 18A may control the supply device groups 141c and 142c based on the kind of the target component included in the recipe information 191 to adjust the temperature of the dissolving liquid supplied to the partition plate 130 from the liquid supply 140. Thus, it is possible to adjust the temperature of the dissolving liquid to a temperature suitable for the kind of the target component.

As stated above, a substrate processing apparatus (for example, the substrate processing system 1) according to the second exemplary embodiment includes multiple processing units (for example, the processing units 16), an exhaust path (for example, the collective exhaust line 55), a gas processing apparatus (for example, the gas processing apparatus 100A), and a controller (for example, the controller 18A). Each of the multiple processing units is configured to process a substrate (for example, the wafer W) by using a chemical (for example, the processing fluid). A gas (for example, the exhaust gas) exhausted from the multiple processing units flows through the exhaust path. The gas processing apparatus 100 is provided in the exhaust path to remove a target component contained in the gas flowing through the exhaust path from the gas. The controller 18A is configured to control the multiple processing units and the gas processing apparatus. The gas processing apparatus includes a duct (for example, the first duct 110 and the second duct 120), a partition plate (for example, the partition plate 130), and a liquid supply (for example, the liquid supply 140). The duct has therein a flow path (for example, the first flow path F1 and the second flow path F2) through which the gas (for example, the exhaust gas) passes. The partition plate is configured to divide the flow path into multiple spaces (for example, the spaces S), and is formed of a porous material, through which the gas passes, configured to retain a liquid. The liquid supply is configured to supply a dissolving liquid configured to dissolve a target component contained in the gas to the partition plate. The controller adjusts a flow rate of the dissolving liquid supplied to the partition plate from the liquid supply according to operation information indicating an operational status of the multiple processing units. Thus, according to the substrate processing apparatus of the second exemplary embodiment, the amount of the dissolving liquid used can be reduced.

Further, the controller according to the second exemplary embodiment starts a supply of the dissolving liquid from the liquid supply at a time point (for example, the time T1) when the controller transmits a signal of starting a supply of the chemical to a processing unit supposed to be operated first among the multiple processing units. Thus, according to the substrate processing apparatus of the second exemplary embodiment, it is possible to start the supply of the dissolving liquid in the gas processing apparatus in synchronization with the supply of the chemical in the processing unit.

In addition, the controller according to the second exemplary embodiment stops the supply of the dissolving liquid from the liquid supply at a time point (for example, the time T4) when the controller receives, from all of the multiple processing units, a signal indicating that a processing of the substrate is finished. Thus, according to the substrate processing apparatus of the second exemplary embodiment, it is possible to stop the supply of the dissolving liquid in the gas processing apparatus in synchronization with the completion of the substrate processing using the chemical in the processing unit.

Furthermore, the liquid supply according to the second exemplary embodiment includes a first liquid supply (for example, the first liquid supply 141) and a second liquid supply (for example, the second liquid supply 142). The first liquid supply is configured to supply the dissolving liquid supplied from a dissolving liquid source (for example, the dissolving liquid source 141b) to the partition plate. The second liquid supply is configured to supply a circulating liquid obtained by circulating the dissolving liquid stored in the storage tank through a circulation path (for example, the circulating liquid line 142a and the pump 142b) to the partition plate. The controller adjusts the flow rate of the dissolving liquid supplied from the first liquid supply to the partition plate and a flow rate of the circulating liquid supplied from the second liquid supply to the partition plate according to the operation information.

To elaborate, the operation information according to the second embodiment is recipe information (for example, the recipe information 191) including a number of processing units to be operated for each time period. The controller adjusts the flow rate of the dissolving liquid supplied from the first liquid supply to the partition plate and the flow rate of the circulating liquid supplied from the second liquid supply to the partition plate based on the number of processing units included in the recipe information. Thus, according to the substrate processing apparatus of the second exemplary embodiment, since excessive use of the dissolving liquid can be suppressed, the amount of the dissolving liquid used can be reduced.

Moreover, the operation information according to the second exemplary embodiment may be recipe information including an amount or a concentration of the target component contained in the gas exhausted from the multiple processing units for each time period. In this case, the controller may adjust the flow rate of the dissolving liquid supplied to the partition plate from the liquid supply based on the amount or concentration of the target component included in the recipe information. Thus, according to the substrate processing apparatus of the second exemplary embodiment, since excessive use of the dissolving liquid can be suppressed, the amount of the dissolving liquid used can be reduced.

Further, the recipe information according to the second exemplary embodiment may further include a kind of the target component. In this case, the controller may change a kind of the dissolving liquid to be supplied to the partition plate from the liquid supply based on the kind of target component included in the recipe information. Thus, according to the substrate processing apparatus of the second exemplary embodiment, it is possible to change the kind of dissolving liquid appropriately in consideration of the kind of the target component.

Additionally, the controller according to the second exemplary embodiment may adjust a temperature of the dissolving liquid supplied to the partition plate from the liquid supply based on the kind of the target component included in the recipe information. Thus, according to the substrate processing apparatus of the second exemplary embodiment, it is possible to adjust the temperature of the dissolving liquid to a temperature suitable for the kind of the target component.

Third Exemplary Embodiment

A substrate processing system 1 according to a third exemplary embodiment is different from the substrate processing system 1 according to the above-described second exemplary embodiment in that it performs a flow rate adjusting processing based on a detection result of a concentration detector configured to detect a concentration of the target component contained in the exhaust gas.

Figure 7:
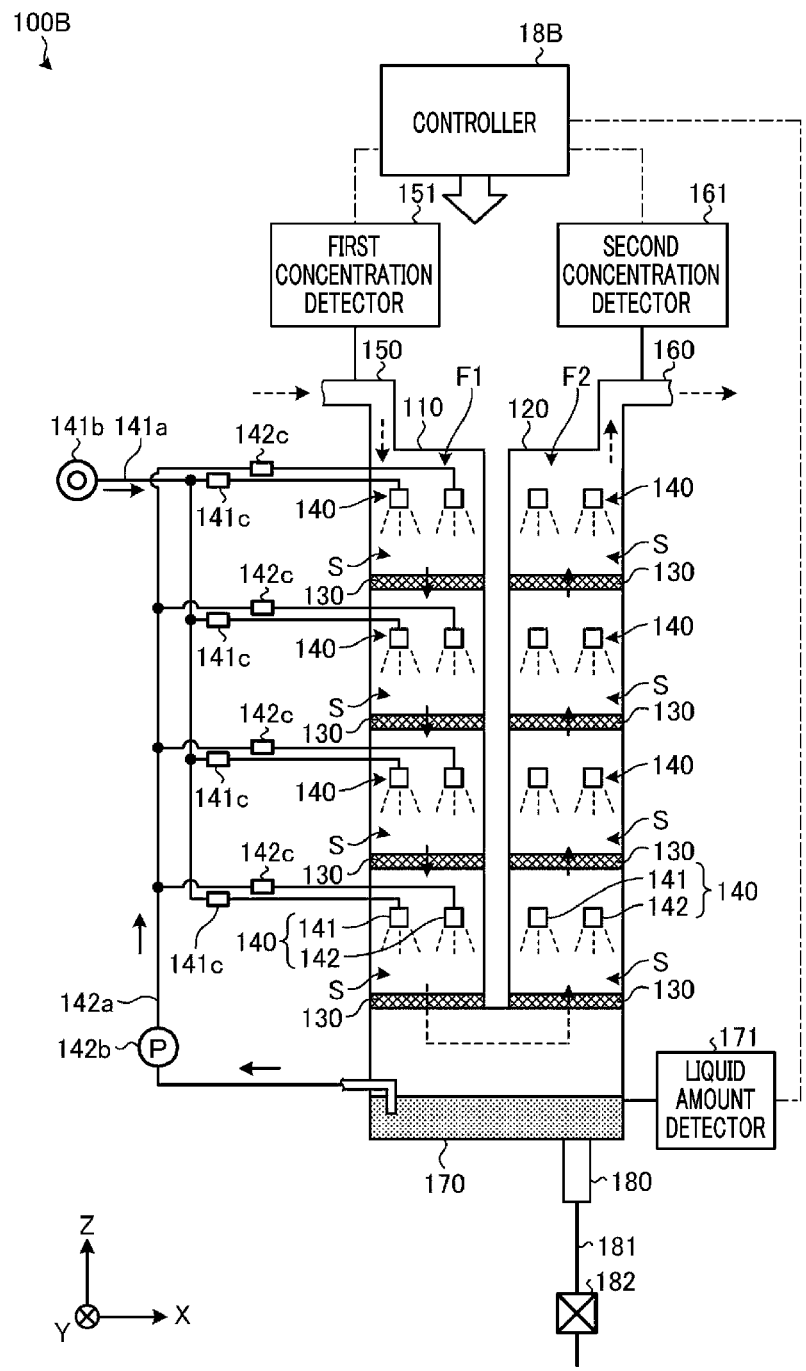
FIG. 7 is a diagram illustrating a configuration of a gas processing apparatus according to a third exemplary embodiment.

FIG. 7 is a diagram showing a configuration of a gas processing apparatus 100B according to the third exemplary embodiment. In FIG. 7, a flow of an exhaust gas is indicated by dashed-lined arrows, and a flow of a cleaning liquid is indicated by solid-lined arrows, the same as in FIG. 5. Further, in FIG. 7, parts identical to those in FIG. 5 will be assigned the same reference numerals.

The plurality of processing units 16 and the gas processing apparatus 100B of the substrate processing system 1 according to the third exemplary embodiment are controlled by a controller 18B.

The gas processing apparatus 100B according to the third exemplary embodiment includes a first concentration detector 151 and a second concentration detector 161. The first concentration detector 151 is provided at the gas inlet 150 and configured to detect a concentration of the target component included in the exhaust gas introduced into the first flow path F1 of the first duct 110 through the gas inlet 150. Further, the second concentration detector 161 is provided at the gas outlet 60, and configured to detect a concentration of the target component included in the exhaust gas exhausted from the second flow path F2 of the second duct 120 through the gas outlet 160.

The detection results by the first concentration detector 151 and the second concentration detector 161 are outputted to the controller 18B.

The controller 18B monitors the detection results by the first concentration detector 151 and the second concentration detector 161 as operation information indicating the operational status of the plurality of processing units 16, and performs the flow rate adjusting processing based on the detection results from the first concentration detector 151 and the second concentration detector 161. That is, the controller 18B controls a flow rate of the dissolving liquid supplied from the first liquid supply 141 to the partition plate 130 and a flow rate of the circulating liquid supplied from the second liquid supply 142 to the partition plate 130 based on the detection results from the first concentration detector 151 and the second concentration detector 161.

Figure 8:
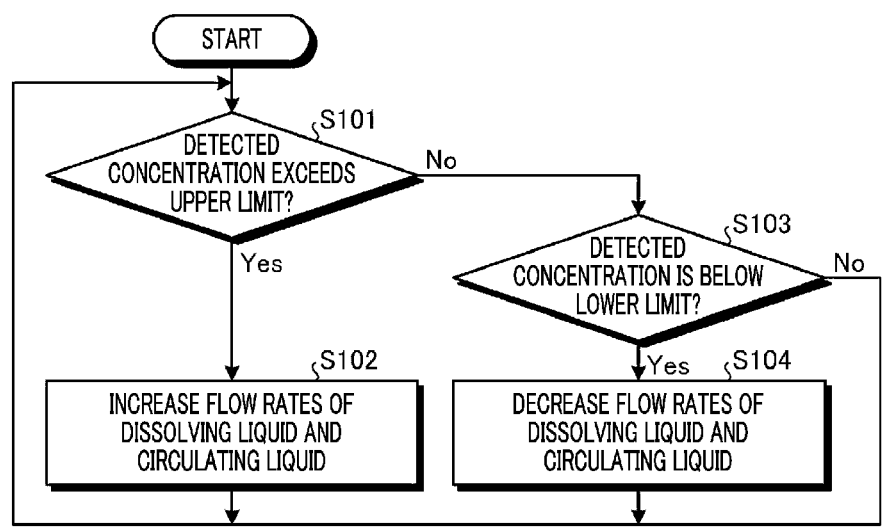
FIG. 8 is a flowchart illustrating an example sequence of a flow rate adjusting processing according to the third exemplary embodiment.

Now, the flow rate adjusting processing of the dissolving liquid controlled by the controller 18B will be explained with reference to FIG. 8. FIG. 8 is a flowchart showing an example sequence of the flow rate adjusting processing according to the third exemplary embodiment.

As depicted in FIG. 8, the controller 18B makes a determination upon whether the concentration detected by the second concentration detector 161, that is, the concentration of the target component contained in the exhaust gas flowing in the gas outlet 160 exceeds a predetermined upper limit (process S101). When it is determined that the concentration detected by the second concentration detector 161 exceeds the predetermined upper limit (process S101; Yes), the controller 18B performs the following processing. That is, the controller 18B controls the supply device groups 141c and 142c to increase the flow rate of the dissolving liquid supplied to the partition plate 130 from the first liquid supply 141 and the flow rate of the circulating liquid supplied to the partition plate 130 from the second liquid supply 142 (process S102).

With the increase of the flow rates of the dissolving liquid and the circulating liquid supplied to the partition plate 130, the amount of the dissolving liquid retained in the partition plate 130 increases. Accordingly, since the possibility of contact between the exhaust gas passing through the partition plate 130 and the dissolving liquid retained in the partition plate 130 can be increased, the dissolution efficiency of the target component by the dissolving liquid can be improved. As a result, it is possible to lower the concentration of the target component included in the exhaust gas exhausted from the gas outlet 160.

Meanwhile, if the concentration detected by the second concentration detector 161 does not exceed the predetermined upper limit (process S101; No), the controller 18B determines whether the concentration detected by the second concentration detector 161 is less than a predetermined lower limit (process S103). When it is determined that the concentration detected by the second concentration detector 161 is below the predetermined lower limit (process S103; Yes), the controller 18B performs the following processing. That is, the controller 18B controls the supply device groups 141c and 142c to decrease the flow rate of the dissolving liquid supplied from the first liquid supply 141 to the partition plate 130 and the flow rate of the circulating liquid supplied from the second liquid supply 142 to the partition plate 130 (process S104).

Upon the completion of the processing of the processes S102 and S104, or if the concentration detected by the second concentration detector 161 in the process S103 is not below the predetermined lower limit (process S103; No), the controller 18B returns the processing back to the process S101. Accordingly, the processings of the processes S101 to S104 are repeated.

When the concentration detected by the second concentration detector 161 is below the predetermined lower limit, it implies that the target component has been removed from the exhaust gas more than necessary. In this case, the flow rate of the dissolving liquid and the flow rate of the circulating liquid may be decreased to reduce the dissolution efficiency of the target component by the dissolving liquid. In this way, the excessive consumption of the dissolving liquid can be suppressed.

Here, the flow rate adjustment is performed based on the detection result of the second concentration detector 161. However, the controller 18B may perform the flow rate adjusting processing of the processes S101 to S104 based on the detection result of the first concentration detector 151. Further, the controller 18B may perform the flow rate adjusting processing of the processes S101 to S104 based on a concentration detected by a third concentration detector (not shown) configured to detect a concentration of the target component contained in the exhaust gas passing through the first flow path F1 of the first duct 110 or the second flow path F2 of the second duct 120.

Furthermore, the controller 18B may determine whether the concentration detected by the first concentration detector 151 or the second concentration detector 161 exceeds a threshold value which is larger than the predetermined upper limit. When it is determined that the concentration detected by the first concentration detector 151 or the second concentration detector 161 exceeds this threshold value, the controller 18B may perform a control of decreasing the flow rate of the exhaust gas exhausted from the plurality of processing units 16. As such a control, a control of limiting the processing unit 16 to be operated, that is, the processing unit 16 that performs the substrate processings with the processing fluid may be considered, for example. As another example, a control of stopping a wafer W belonging to a lot following the lot including the wafer W being processed in the processing unit 16 from being taken out of the carrier C may also be considered. Still alternatively, by performing a control of reducing the flow rate of the exhaust gas exhausted from the plurality of processing units 16, the concentration of the target component included in the exhaust gas introduced from the gas inlet 150 can be lowered.

As stated above, a gas processing apparatus (for example, the gas processing apparatus 100B) of a substrate processing apparatus (for example, the substrate processing system 1) according to the third exemplary embodiment includes a concentration detector (for example, the first concentration detector 151 and the second concentration detector 161). The concentration detector detects a concentration of a target component contained in a gas (for example, the exhaust gas). Then, a controller (for example, the controller 18B) according to the third exemplary embodiment monitors the detection result of the concentration detector as operation information. Based on the detection result of the concentration detector, the controller adjusts a flow rate of a dissolving liquid supplied from a first liquid supply (for example, the first liquid supply 141) to a partition plate (for example, the partition plate 130) and a flow rate of a circulating liquid supplied to the partition plate from a second liquid supply (for example, the second liquid supply 142). Thus, according to the substrate processing apparatus of the third exemplary embodiment, since the excessive consumption of the dissolving liquid can be suppressed, the consumption amount of the dissolving liquid can be reduced.

(Others)

In the above-described exemplary embodiments, the first duct 110 and the second duct 120 are disposed to extend in the vertical direction (Z-axis direction). However, the layout of the first duct 110 and the second duct 120 is not limited thereto. By way of example, the first duct 110 and the second duct 120 may be inclined with respect to the vertical direction (Z-axis direction).

Further, in the above-described exemplary embodiments, the storage tank 170 stores therein the dissolving liquid falling from the partition plates 130 disposed in each of the first flow path F1 of the first duct 110 and the second flow path F2 of the second duct 120. However, the storage tank 170 may be divided for each duct individually. For example, the storage tank 170 may be divided into a first storage section corresponding to the first duct 110 and a second storage section corresponding to the second duct 120 by a partition wall. In this case, the first storage section stores therein the dissolving liquid falling from the partition plates 130 disposed in the first flow path F1 of the first duct 110 and the second storage section stores therein the dissolving liquid falling from the second flow path F2 of the second duct 120. Further, when the storage tank 170 is divided into the first storage section and the second storage section by the partition wall, different types of dissolving liquids may be supplied to the inside of the first duct 110 and the inside of the second duct 120 from the liquid supply 140.

Further, in the second exemplary embodiment and the third exemplary embodiment described above, the flow rate adjusting processing of the dissolving liquid is performed based on the operation information. However, it may be possible to increase or decrease, among the plurality of liquid supplies 140, the number of liquid supplies 140 that perform the supply of the dissolving liquid to the partition plate 130 based on the operation information. By way of example, the controller 18A may control the supply device groups 141c and 142c to decrease the number of liquid supplies 140 performing the supply of the dissolving liquid to the partition plate 130 with a decrease of the number of processing units 16 included in the recipe information 191, that is, the number of processing units 16 in operation. Accordingly, the consumption amount of the dissolving liquid can be reduced.

In addition, in the second exemplary embodiment and the third exemplary embodiment described above, it may also be possible to increase or decrease the number of liquid supplies 140 performing the supply of the dissolving liquid to the partition plate 130 among the plurality of liquid supplies 140 according to lot specifying information that specifies a lot including wafers W to be processed in the processing unit 16. For example, the controller 18A may control the supply device groups 141c and 142c in a period in which the wafer W included in the lot specified by the lot specifying information is not sent out from the carrier C to reduce the number of liquid supplies 140 performing the supply of the dissolving liquid to the partition plate 130. Accordingly, the consumption amount of the dissolving liquid can be reduced.

It should be noted that the above-described exemplary embodiment is illustrative in all aspects and is not anyway limiting. The above-described exemplary embodiment may be omitted, replaced and modified in various ways without departing from the scope and the spirit of claims.

According to the exemplary embodiment, it is possible to achieve the effect of reducing the amount of the dissolving liquid used.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus, comprising:
multiple processing units each configured to process a substrate by using a chemical;
an exhaust path through which a gas exhausted from the multiple processing units flows;
a gas processing apparatus provided in the exhaust path to remove a target component contained in the gas flowing through the exhaust path from the gas; and
a controller configured to control the multiple processing units and the gas processing apparatus,
wherein the gas processing apparatus comprises:
a duct having therein a flow path through which the gas passes;

at least one partition plate configured to divide the flow path into multiple spaces, and formed of a porous material, through which the gas passes, configured to retain a liquid; and at least one liquid supply configured to supply a dissolving liquid configured to dissolve the target component contained in the gas to each of the at least one partition plate, and wherein the controller adjusts a flow rate of the dissolving liquid supplied to the at least one partition plate from the at least one liquid supply according to operation information indicating an operational status of the multiple processing units, and the operation information is recipe information including a number of the processing units to be operated for a time period.

2. The substrate processing apparatus of claim 1, wherein the controller starts a supply of the dissolving liquid from the liquid supply at a time point when the controller transmits a signal of starting a supply of the chemical to a processing unit supposed to be operated first among the multiple processing units.

3. The substrate processing apparatus of claim 2, wherein the controller stops the supply of the dissolving liquid from the at least one liquid supply at a time point when the controller receives, from all of the multiple processing units, a signal indicating that a processing of each respective substrate is finished.

4. The substrate processing apparatus of claim 1, wherein the duct of the gas processing apparatus includes multiple ducts, wherein the multiple ducts include:

a first duct having therein a first flow path through which the gas passes from an upper side toward a lower side thereof; and a second duct having therein a second flow path through which the gas passes from a lower side toward an upper side thereof, wherein the at least one partition plate is disposed in each of the first flow path and the second flow path to partition each of the first flow path and the second flow path into multiple spaces, and the gas processing apparatus further comprises a storage tank configured to connect a downstream side of the first flow path to an upstream side of the second flow path, and configured to store therein dissolving liquid failing from the at least one partition plate.

5. The substrate processing apparatus of claim 4, wherein the liquid supply comprises:

a first liquid supply configured to supply the dissolving liquid supplied from a dissolving liquid source to the at least one partition plate; and a second liquid supply configured to supply a circulating liquid obtained by circulating the dissolving liquid stored in the storage tank through a circulation path to the at least one partition plate, and wherein the controller adjusts the flow rate of the dissolving liquid supplied from the first liquid supply to the at least one partition plate and a flow rate of the circulating liquid supplied from the second liquid supply to the at least one partition plate according to the operation information.

6. The substrate processing apparatus of claim 5, wherein the controller adjusts the flow rate of the dissolving liquid supplied from the first liquid supply to the at least one partition plate and the flow rate of the circulating liquid supplied from the second liquid supply to the at least one partition plate based on the number of the processing units included in the recipe information.

7. The substrate processing apparatus of claim 5, wherein the gas processing apparatus further comprises:

a concentration detector configured to detect a concentration of the target component contained in the gas, and wherein the controller monitors a detection result of the concentration detector as the operation information, and adjusts the flow rate of the dissolving liquid supplied from the first liquid supply to the at least one partition plate and the flow rate of the circulating liquid supplied from the second liquid supply to the at least one partition plate based on the detection result of the concentration detector.

8. The substrate processing apparatus of claim 7, wherein the controller determines whether the concentration detected by the concentration detector exceeds a threshold value which is larger than a predetermined upper limit, and when it is determined that the concentration detected by the concentration detector exceeds the threshold value, the controller performs a control of decreasing a flow rate of the gas exhausted from the multiple processing units.

9. The substrate processing apparatus of claim 1, wherein the recipe information includes an amount or a concentration of the target component contained in the gas exhausted from the multiple processing units for the time period, and the controller adjusts the flow rate of the dissolving liquid supplied to the at least one partition plate from the at least one liquid supply based on the amount or the concentration of the target component included in the recipe information.

10. The substrate processing apparatus of claim 9, wherein the recipe information further includes a kind of the target component, and the controller changes a kind of the dissolving liquid to be supplied to the partition plate from the at least one liquid supply based on the kind of the target component included in the recipe information.

11. The substrate processing apparatus of claim 10, wherein the controller adjusts a temperature of the dissolving liquid supplied to the at least one partition plate from the at least one liquid supply based on the kind of the target component included in the recipe information.

12. The substrate processing apparatus of claim 1, wherein the at least one liquid supply includes multiple liquid supplies, and at least one of the multiple liquid supplies is disposed in each of the multiple spaces, and the controller increases or decreases a number of the liquid supplies that performs the supply of the dissolving liquid according to the operation information.

13. A control method of a substrate processing apparatus, wherein the substrate processing apparatus comprises:

multiple processing units each configured to process a substrate by using a chemical;

an exhaust path through which a gas exhausted from the multiple processing units flows; and a gas processing apparatus provided in the exhaust path to remove a target component contained in the gas flowing through the exhaust path from the gas, and wherein the gas processing apparatus comprises:

a duct having therein a flow path through which the gas passes;

at least one partition plate configured to divide the flow path into multiple spaces, and formed of a porous material, through which the gas passes, configured to retain a liquid; and at least one liquid supply configured to supply a dissolving liquid configured to dissolve the target component contained in the gas to each of the at least one partition plate, and wherein the control method of the substrate processing apparatus comprises adjusting a flow rate of the dissolving liquid supplied to the at least one partition plate from the at least one liquid supply according to operation information indicating an operational status of the multiple processing units, and the operation information is recipe information including a number of the processing units to be operated for a time period.

* * * * *